(12) United States Patent
Oba et al.

(10) Patent No.: US 6,878,201 B2
(45) Date of Patent: Apr. 12, 2005

(54) METHODS OF MAKING FLUORIDE CRYSTAL AND FLUORIDE CRYSTAL LENS

(75) Inventors: Tomoru Oba, Kashiwa (JP); Toshio Ichizaki, Ami-machi (JP)

(73) Assignee: Canon Kabushiki Kaisha, Tokyo (JP)

( * ) Notice: Subject to any disclaimer, the term of this patent is extended or adjusted under 35 U.S.C. 154(b) by 195 days.

(21) Appl. No.: 09/956,043

(22) Filed: Sep. 20, 2001

(65) Prior Publication Data

US 2002/0020338 A1 Feb. 21, 2002

Related U.S. Application Data

(63) Continuation-in-part of application No. 08/818,183, filed on Mar. 14, 1997.

(30) Foreign Application Priority Data

Mar. 22, 1996 (JP) .............................................. 8-066758
Mar. 22, 1996 (JP) ........................................... 8-0667757

(51) Int. Cl.⁷ .............................................. C30B 11/04
(52) U.S. Cl. ............................. 117/76; 117/81; 117/82; 117/83; 117/940
(58) Field of Search .............................. 117/76, 81, 82, 117/83, 940

(56) References Cited

U.S. PATENT DOCUMENTS 4,251,315 A  2/1981 Pastor ........................ 117/940
5,178,719 A  1/1993 Pandelisev ................... 117/940
5,981,075 A  11/1999 Ohmi et al. ................. 428/428

FOREIGN PATENT DOCUMENTS

| JP | 2-293397 | 12/1990 |
| JP | 3-115196 | 5/1991 |
| JP | 4-349198 | 12/1992 |
| JP | 4-349199 | 12/1992 |
| JP | 10-1310 | 1/1998 |

OTHER PUBLICATIONS

E.M. Olympios, "Removal of Oxygen Impurity During the Growth of CaF2 Single Crystals," 14 *Radiation Effects* 119–121 (1972).

M. Robinson et al., "Growth–Quality Rare–Earth Fluoride Single Crystals in a Dynamic Hydrogen Fluoride Atmosphere," 37(5) J. Appl. Phys. 2072–2074 (1966).

H.C. Kremers, "Synthetic Optical Crystals," 31(11) *Industrial Engineering Chemistry* 1478–1482.

*Primary Examiner*—Robert Kunemund
(74) *Attorney, Agent, or Firm*—Fitzpatrick, Cella, Harper & Scinto

(57) ABSTRACT

A method of making a fluoride crystal suitable for use as an optical element is disclosed. The method includes a mixing step for mixing a prepared raw fluoride material with a scavenger to yield a fluoride mixture. In a preliminary step, the fluoride mixture is formed into a fluoride disk. A grown fluoride crystal is formed by melting and then gradually cooling the fluoride disk in a cylindrical crucible. The grown fluoride crystal is then annealed.

34 Claims, 11 Drawing Sheets

METHODS OF MAKING FLUORIDE CRYSTAL AND FLUORIDE CRYSTAL LENS

This is a continuation-in-part of application Ser. No. 08/818,183 filed Mar. 14, 1997.

BACKGROUND OF THE INVENTION

1. Field of the Invention

The present invention relates to methods of making fluoride crystals and fluoride crystal lenses. In particular, the present invention relates to a method of making a fluoride crystal which is used in optical articles such as lenses which are transparent to excimer laser beams and the like.

2. Description of the Related Art

Excimer lasers have attracted attention as the only high-output laser which can oscillate in an ultraviolet region, and have been applied in electronic, chemical and energy industrial fields. In these industrial fields, the excimer laser is used for processing metal, resin, glass, ceramic and semiconductor articles as well as for chemical reactions.

The equipment for generating an excimer laser beam is known as an excimer laser oscillator. A laser gas such as Ar, Kr, Xe, $F_2$, or $Cl_2$ is filled into a chamber and is excited by electron beam irradiation or electrical discharge. The excited atoms bond to atoms in a ground state to form molecules which can be present in an excited state. Such molecules are called excimers. The excimers are unstable and immediately return to the ground state, simultaneously emitting ultraviolet light. This phenomenon is referred to as bond-free transition. An excimer laser oscillator amplifies ultraviolet light formed by the bond-free transition with an optical resonator comprising a pair of mirrors and outputs it as a laser light beam.

Among excimer laser beams, the KrF laser beam and the ArF laser beam operate in a vacuum ultraviolet region and have wavelengths of 248 nm and 193 nm, respectively. Optical articles must have high transparencies in such a region. Fluorides such as calcium fluoride are suitable for such optical articles. Known fluorides include calcium fluoride, magnesium fluoride, barium fluoride, neodymium fluoride, lithium fluoride and lanthanum fluoride.

Conventional methods of making fluoride crystals will be illustrated using calcium fluoride ($CaF_2$), referred to as fluorite, as a typical example. Methods of making fluoride crystals are disclosed in, for example, Japanese Unexamined Patent Publication Nos. 4-349,198 and 4-349,199. When high purity powdery raw material prepared by a synthetic process is melted using these methods, the volume of the raw material vastly decreases during melting in a crystal growing furnace due to the low bulk density of the powder. Thus, a high purity crushed solid material like cullet is used in the crucible to avoid such volume reduction.

FIG. 8 is a flow chart illustrating a method of making a fluoride crystal which the present inventors used before they discovered the present invention. Raw powder is prepared in step S1, melted and then cooled in a container as shown in step S2. The solid bulk is crushed with a stainless steel crusher in step S3. The crushed solid is placed and melted in a crucible for crystal growth, and gradually cooled to grow a fluoride crystal in step S4. Step S2 is to reduce the bulk density change which occurs during melting in step S4. The resulting fluoride crystal is shaped into a lens and the like, and is used as an optical article.

Although the fluoride crystal obtained by the method set forth above exhibits more satisfactory characteristics in general visible light optical articles than those obtained by other prior art methods, its optical characteristics deteriorate during repeated irradiation cycles of high output light having a short wavelength, such as an excimer laser beam.

The present inventors have found that the deterioration is induced by the structure of and the impurities in the fluoride crystal resulting from the method of making the fluoride crystal. It was found that large amounts of impurities, e.g. water, iron, nickel and chromium, are included in the fluoride raw material of step S3 set forth above, and these impurities cause characteristic deterioration during consecutive irradiation of high-output short-wavelength light over long time periods.

Further, in the above-mentioned method, since the bulk density of the fluoride decreases in the process from step S3 to step S4, only a relatively small size fluoride crystal can be obtained unless a large crystal growing furnace is used. Thus, this method inefficiently produces fluoride crystal and has high production costs. If large crystal production is sought using this method, a larger furnace must be provided, resulting in an increase in start-up costs. Moreover, the melting step S2 and the crushing step S3 increase the production period and decrease throughput.

SUMMARY OF THE INVENTION

It is an object of the present invention to provide a method of making a fluoride crystal in which the light transparency does not deteriorate by consecutive irradiation of high output shortwave light over long time periods.

It is another object of the present invention to provide a method of making a fluoride crystal preferably used in an excimer laser optical system.

It is a further object of the present invention to provide a method of making a fluoride crystal which can produce a highly reliable optical article.

It is a still further object of the present invention to provide a method of making a fluoride crystal which does not need a crushing step and can produce optical articles with low production costs.

In accordance with a first aspect of the present invention, a method of making a fluoride crystal comprises:
a mixing step for mixing a prepared raw fluoride material with a scavenger to obtain a fluoride mixture; a preliminary step for forming the fluoride mixture into a fluoride disk; a crystal growing step for melting and then gradually cooling the fluoride disk in a cylindrical crucible to obtain a grown fluoride crystal; and an annealing step for annealing the grown fluoride crystal.

In the first aspect, the preliminary step may comprise a step of melting the fluoride mixture and shaping the melt into a fluoride disk, or the preliminary step may comprise a press-forming step of shaping the fluoride mixture into a fluoride disk. The press-forming step may comprise pressing the fluoride mixture in a mold under a pressure of 500 $kgf/cm^2$ or more.

The diameter of the cylindrical crucible is the same as the diameter of the fluoride disk shaped in the preliminary step, or larger than the diameter of the fluoride disk shaped in the preliminary step.

The crucible may be a block-type crucible, or the crucible may be a disk-type crucible.

In accordance with a second aspect of the present invention, a method of making a fluoride crystal comprises:
a preliminary step for melting and then crystallizing a prepared fluoride raw material in a first cylindrical crucible; a crystal growing step for melting and then gradually cooling the fluoride raw material preliminary treated in a second cylindrical crucible having a larger diameter than the first cylindrical crucible to obtain a grown fluoride crystal; and an annealing step for annealing the grown fluoride crystal.

In these methods, the method may further comprise a mixing step for mixing a prepared raw fluoride material with a scavenger.

In accordance with a third aspect of the present invention, a method of making a fluoride crystal comprises: a mixing step for mixing a prepared raw fluoride material with a scavenger to obtain a fluoride mixture; a preliminary step for melting and then crystallizing the fluoride mixture in a first cylindrical crucible; a crystal growing step for melting and then gradually cooling the fluoride mixture preliminary treated in a second cylindrical crucible to obtain a grown fluoride crystal; and an annealing step for annealing the grown fluoride crystal.

In this method, the first cylindrical crucible may have the same diameter as the second cylindrical crucible or a smaller diameter than the second cylindrical crucible.

In accordance with a fourth aspect of the present invention, a method of making a fluoride crystal comprises: a mixing step for mixing a prepared raw fluoride material with a scavenger to obtain a fluoride mixture; a preliminary step for melting and then crystallizing the fluoride mixture in a first cylindrical crucible; a crystal growing step for melting and then gradually cooling the preliminary treated fluoride mixture in a second cylindrical crucible having a larger diameter than the first cylindrical crucible to obtain a grown fluoride crystal; and an annealing step for annealing the grown fluoride crystal.

In the methods set forth above, the fluoride may be calcium fluoride, or the fluoride may be any one of magnesium fluoride, barium fluoride, neodymium fluoride, lithium fluoride and lanthanum fluoride.

The scavenger may be either of zinc fluoride or bismuth fluoride.

The mixing step may comprise a step of placing the fluoride raw material and the scavenger into a container and rotating the container for mixing.

The preliminary step may comprise a step of removing the surface layer of the crystallized fluoride.

The crystal growing step may succeed the preliminary step without crushing the fluoride disk.

At least one of the first crucible and the second crucible may be a block-type crucible, or at least one of the first crucible and the second crucible may be a disk-type crucible.

The grown fluoride crystal may be subjected to external shaping after the annealing step.

In accordance with a fifth aspect of the present invention, a method of making a fluoride crystal lens comprises external shaping of a fluoride crystal produced by any one of methods described set forth above.

The method may further comprise forming an antireflection coating on a surface of the fluoride crystal lens.

In accordance with a sixth aspect of the present invention, a method of making a fluoride crystal comprises: a mixing step for mixing a prepared raw fluoride material with a scavenger to obtain a fluoride mixture; a pressing step for forming a fluoride block from the fluoride mixture; a crystal growing step for melting and then gradually cooling the fluoride block in a cylindrical crucible to obtain a grown fluoride crystal; and an annealing step for annealing the grown fluoride crystal.

Further objects, features and advantages of the present invention will become apparent from the following description of the preferred embodiments with reference to the attached drawings.

DETAILED DESCRIPTION OF THE PREFERRED EMBODIMENTS

First Embodiment

Figure 1:
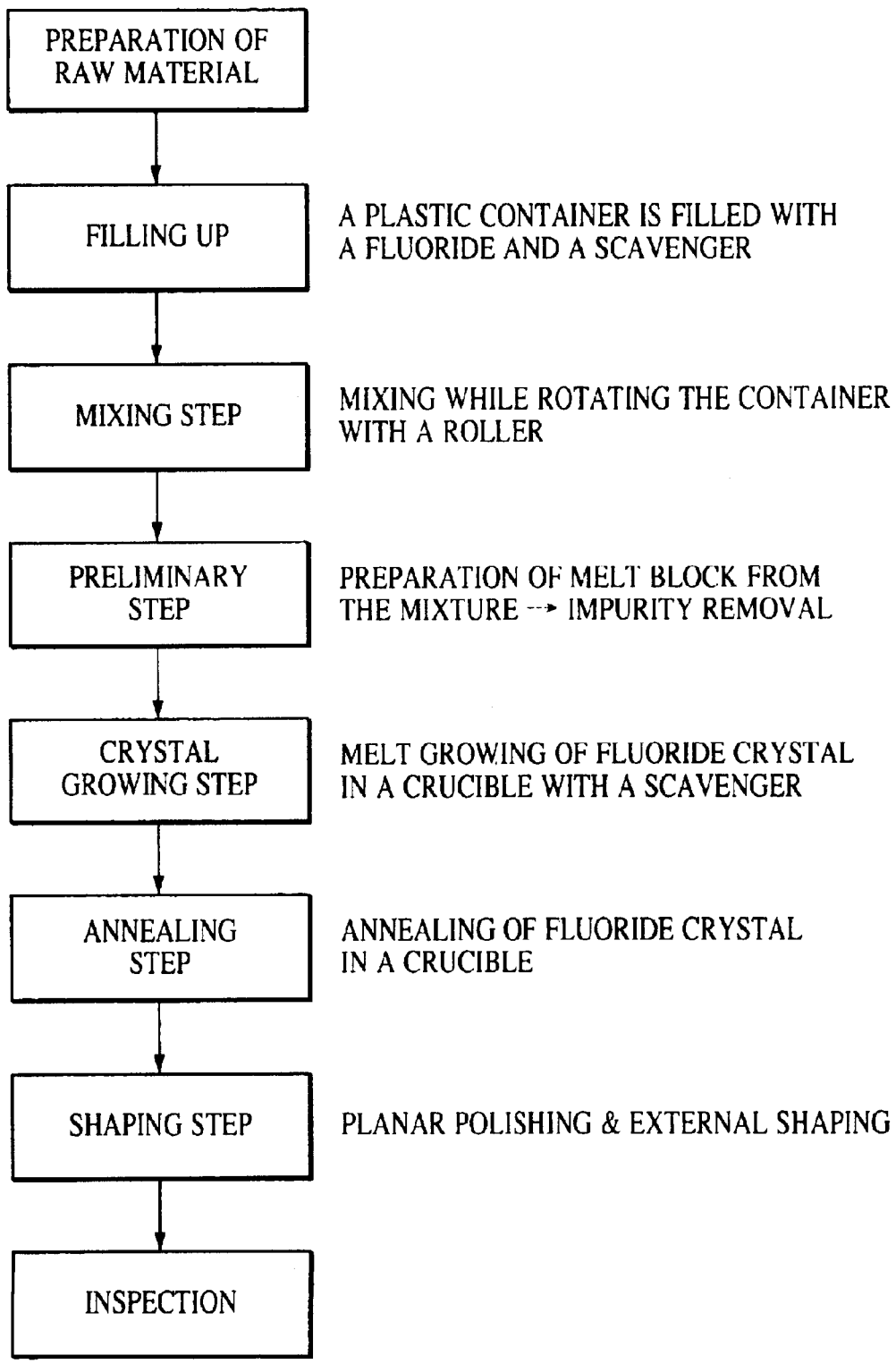
FIG. 1 is a flow chart illustrating fluoride crystal production steps in accordance with the first embodiment of the present invention.
Figure 2:
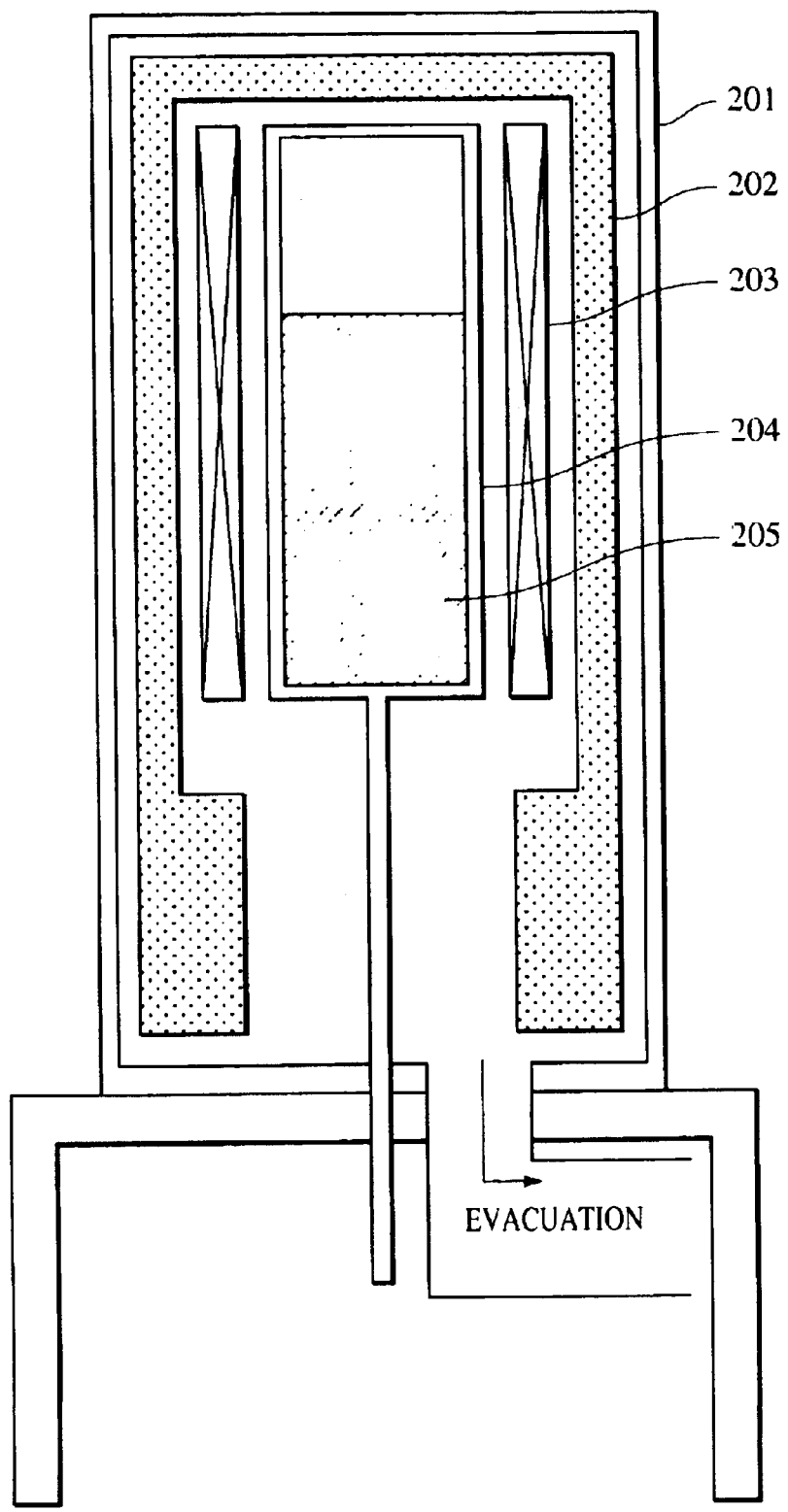
FIG. 2 is a cross-sectional view of an embodiment of a refining furnace used in fluoride crystal production in accordance with the present invention.

A first embodiment of the present invention will now be illustrated with reference to FIGS. 1 thorough 4. FIG. 1 is a flow chart for illustrating fluoride crystal production steps in accordance with the first embodiment of the present invention, and FIG. 2 is a cross-sectional view of a refining furnace used in the preliminary step shown in FIG. 1. The refining furnace comprises a chamber 201, a thermal insulation material 202, a heater 203 and a first crucible 204 to melt fluoride 205.

Figure 3:
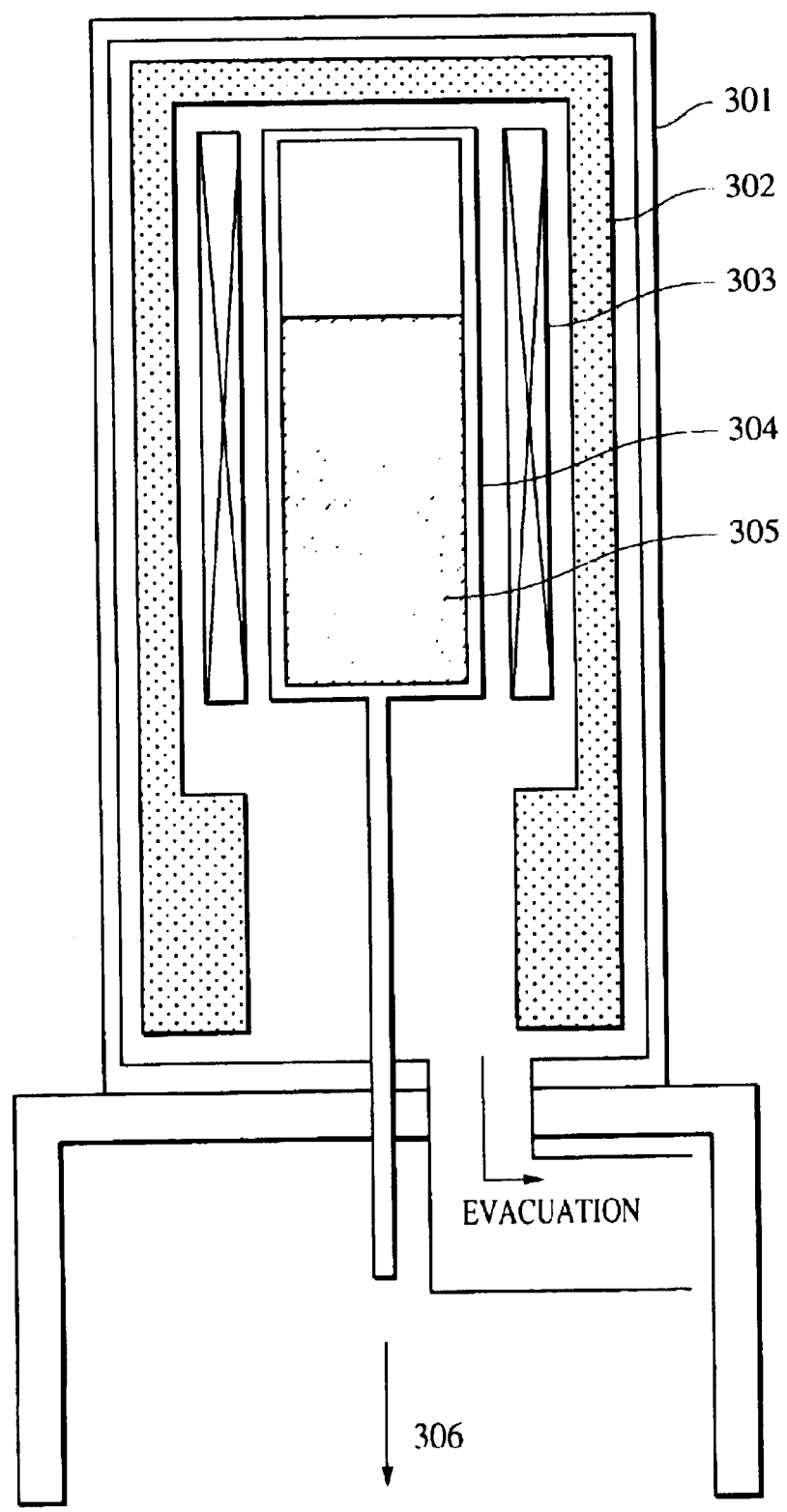
FIG. 3 is a cross-sectional view of an embodiment of a crystal growing furnace used in fluoride crystal production in accordance with the present invention.
Figure 4:
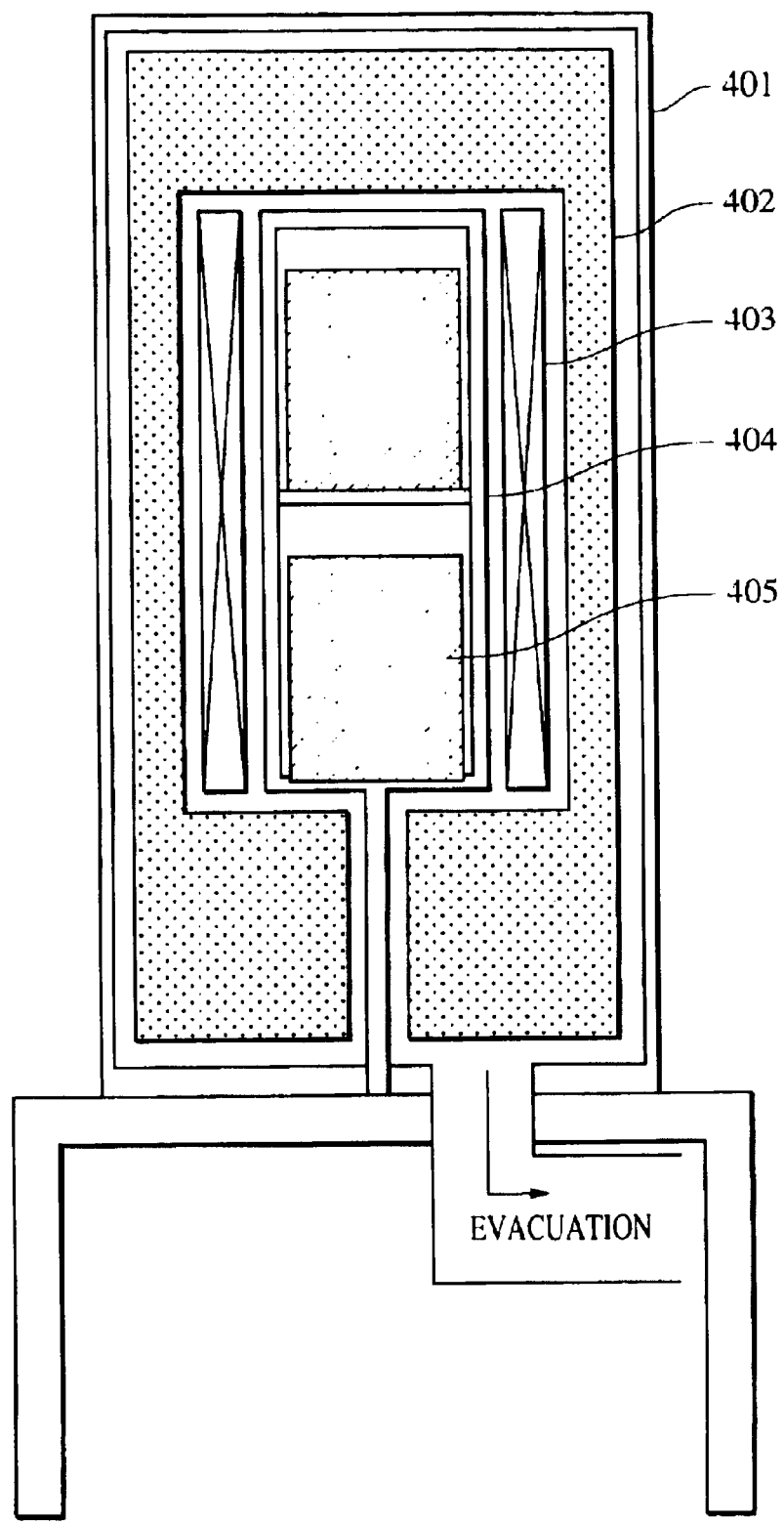
FIG. 4 is a cross-sectional view of an embodiment of an annealing furnace used in fluoride crystal production in accordance with the present invention.

FIG. 3 is a cross-sectional view of a block-type crystal growing furnace used in the crystal growing step shown in FIG. 1. The block-type crystal growing furnace comprises a chamber 301, a thermal insulation material 302, a heater 303, a block-type second crucible 304 for melting and crystallizing fluoride 305, and a crucible lowering mechanism 306. FIG. 4 is an annealing furnace used in the annealing step shown in FIG. 1. The annealing furnace comprises a chamber 401, a thermal insulation material 402, a heater 403, and a crucible 404 for annealing fluoride 405.

A preferable fluoride crystal production process in accordance with the present invention will now be illustrated with reference to calcium fluoride as an example of fluoride.

(Preparation of Raw Material)

It is preferable to use a fluoride made by chemical synthesis than a raw fluorite ore as a raw material in the present invention.

(Mixing Step)

Calcium fluoride is mixed with a scavenger. The mixing is preferably performed by rotating a container filled with calcium fluoride and the scavenger. Examples of preferable scavengers include cadmium fluoride, lead fluoride, zinc fluoride, bismuth fluoride, sodium fluoride and lithium fluoride. It is preferable that the reactivities of these scavengers with oxygen are higher than that of the fluoride crystal which is grown. Such scavengers are reactive with the oxides contained in the raw synthesized fluoride and are easily removable and therefore do not affect the optical characteristics of the finished fluoride crystal. Among these scavengers, those having low melting points, such as zinc, fluoride and bismuth fluoride are preferable. For example, a zinc fluoride scavenger can convert calcium oxide formed in the presence of water into calcium fluoride as shown in the following equations:

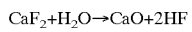

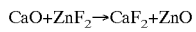

The amount of the scavenger preferably ranges from 0.05 mol % to 5 mol %, and more preferably from 0.1 mol % to 1 mol % of the calcium fluoride. The formed ZnO can be removed at a high temperature.

(Preliminary Step)

In the preliminary step, the fluoride mixture is melted and crystallized in the first crucible 204. A melting temperature higher than the melting point of the fluoride used is determined, and preferably ranges from 1,390 to 1,450° C. Crystallization is performed by cooling the fluoride melt. The formed fluoride crystal may be polycrystal or single-crystal. The surface layer of the fluoride crystal is removed by a thickness of 1 to 2 mm.

(Growing Step)

In the single-crystal growing step, the preliminary treated fluoride crystal is transferred to a second crucible 304 having a larger diameter than the first crucible 204. The diameter ratio of the second crucible 304 to the first crucible 204 preferably ranges from 1.05 to 1.1, so that the ratio of the diameter of the fluoride crystal formed in the first crucible 204 to the diameter of the second crucible 304 is 0.9 to 0.95. After the fluoride crystal is melted by heating the second crucible 304 to a temperature of 1,390 to 1,450° C., the second crucible 304 is lowered at a rate of 0.1 to 5.0 mm/hour. The fluoride melt in the second crucible 304 gradually crystallizes due to the spontaneous temperature drop without controlled cooling. In the single-crystal growing step, a scavenger is preferably added to the raw fluoride crystal in the growing furnace to remove calcium oxide.

(Annealing step)

The grown fluoride crystal 405 is annealed in the annealing crucible 404 by heating to a temperature of 900 to 1,000° C. with the heater 403 in FIG. 4. It is preferred that the annealing be performed for 20 hours or more, and more preferably 20 to 30 hours.

In accordance with the production method, the bulk density does not change substantially before and after crystal growth, and a high packing density of the fluoride crystal can be achieved in the crystal growing furnace. The resulting fluoride single-crystal contains reduced impurities of no greater than 10 ppm (10 $\mu$g/1 g of single-crystal) of, for example, water, iron, nickel and chromium.

The fluoride single-crystal is shaped into desired optical articles, e.g. concave lenses, convex lenses, disks and plates. Antireflection coatings may be provided on the surfaces of the fluoride optical articles according to demand. Preferable examples of antireflection coating materials include magnesium fluoride, aluminum oxide and tantalum oxide. These antireflection coatings can be deposited on the fluoride optical articles by resistive heating deposition, electron beam deposition or sputtering. The optical articles obtained with the method in accordance with the present invention do not substantially contain water and have excellent adhesiveness to antireflection coatings.

An optical system suitable for excimer lasers and in particular ArF excimer lasers can be provided by combining the various lenses obtained. A combination of an excimer laser light source, an optical system having lenses of calcium fluoride and a stage for moving a substrate provides an exposure apparatus. As excimer laser light is irradiated to a light sensitive resist on a substrate through a reticle pattern using the exposure apparatus, a latent image corresponding to the reticle pattern forms on the resist.

Second Embodiment

Figure 5:
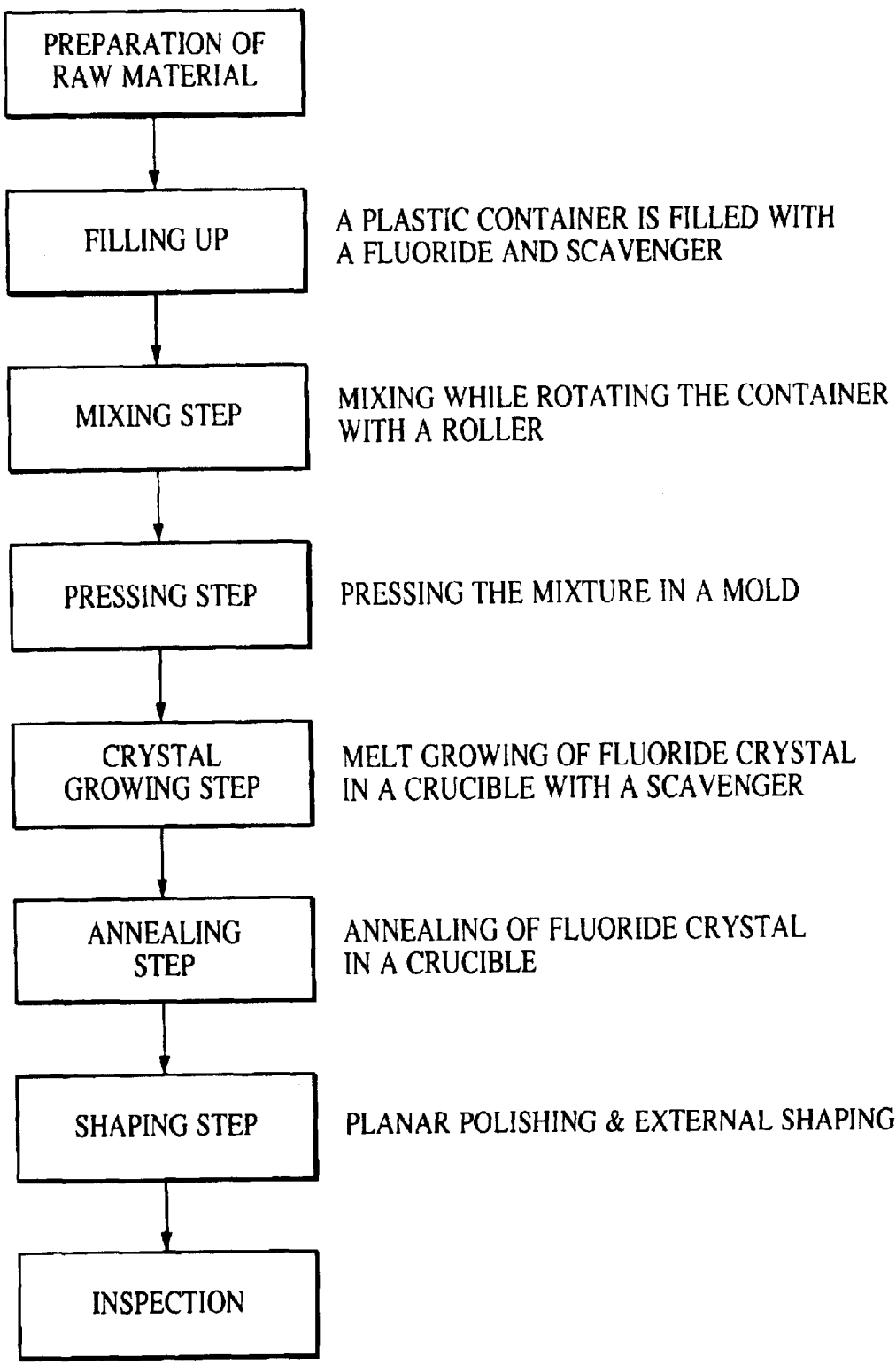
FIG. 5 is a flow chart for illustrating fluoride crystal production steps in accordance with the second embodiment of the present invention.

FIG. 5 is a flow chart illustrating a fluoride crystal production process in accordance with a second embodiment of the present invention. In the second embodiment, the preparation of raw material and mixing steps are identical to the first embodiment, but a pressing step is provided instead of the preliminary step in the first embodiment. Thus, the crystal growing step in the second embodiment is different from that in the first embodiment. Regarding the annealing step, both embodiments can be the same. The pressing and annealing steps in the second embodiment will be illustrated.

(Pressing Step)

Figure 6:
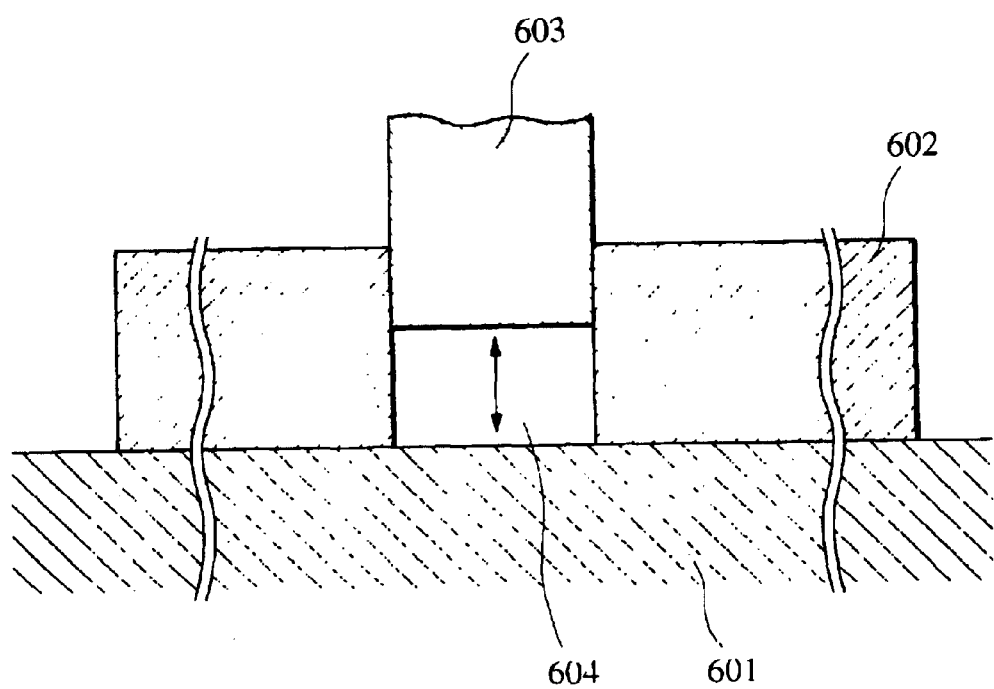
FIG. 6 is a cross-sectional view of an embodiment of a pressing machine used in fluoride crystal production in accordance with the present invention.

FIG. 6 is a cross-sectional view which illustrates pressing fluoride powder with a powder pressing machine. A fluoride mixture 604 is placed in a mold 602 and press-formed with a pressing member 603 to increase the bulk density. A preferable pressing force is 500 kgf/cm$^2$.

(Growing Step)

The fluoride block prepared in the pressing step is transferred to the second crucible 304 set forth above, heated to 1,390 to 1,450° C. with the heater 303 to melt the block, and gradually cooled while lowering the crucible 304 by the crucible lowering mechanism 306 at a rate of 0.1 to 5.0 mm/hour. The fluoride melt in the second crucible 304 gradually crystallizes while the crucible is lowered.

Third Embodiment

Figure 7:
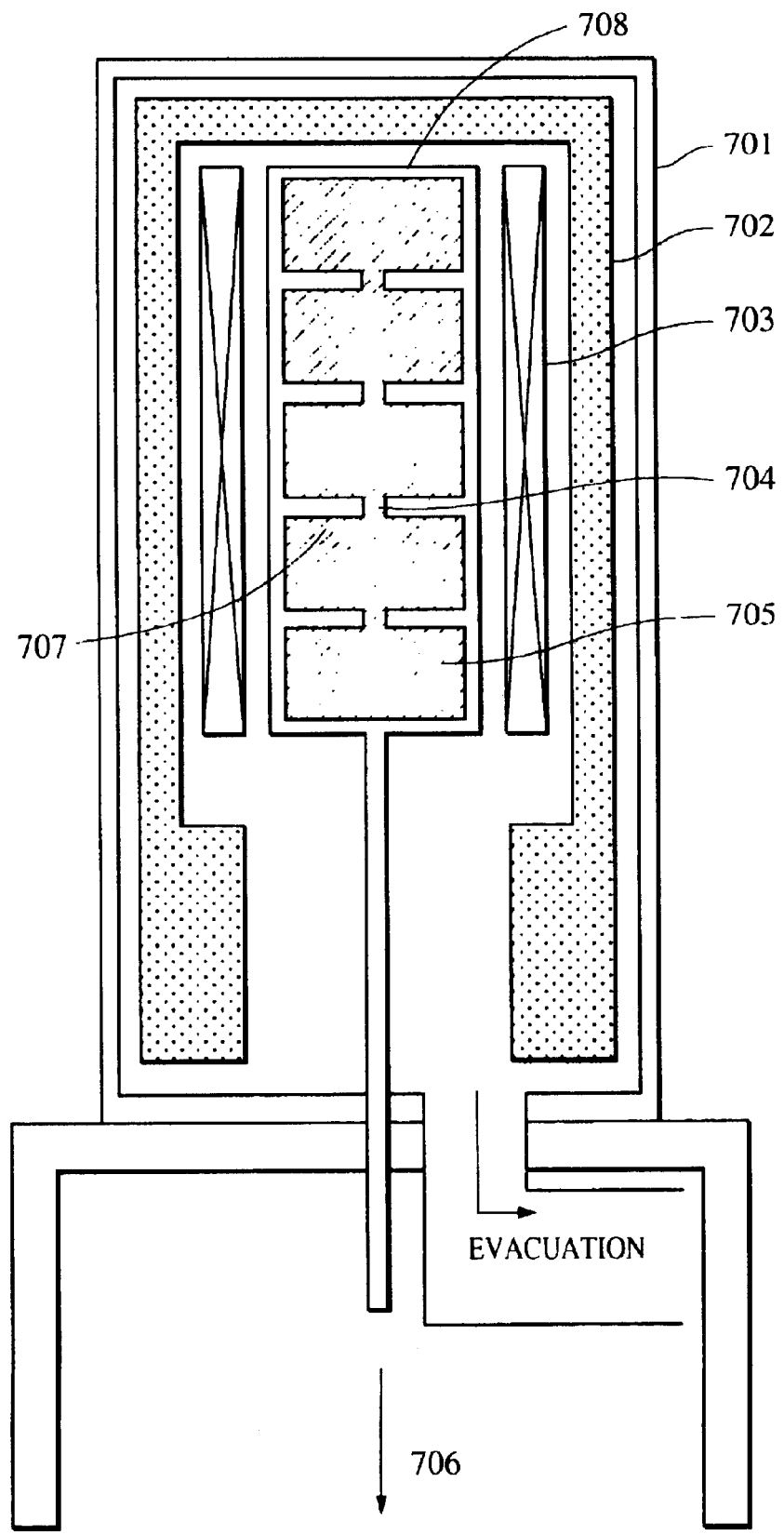
FIG. 7 is a cross-sectional view of an embodiment of a crystal growing furnace used in a third embodiment of the fluoride crystal production in accordance with the present invention.
Figure 8:
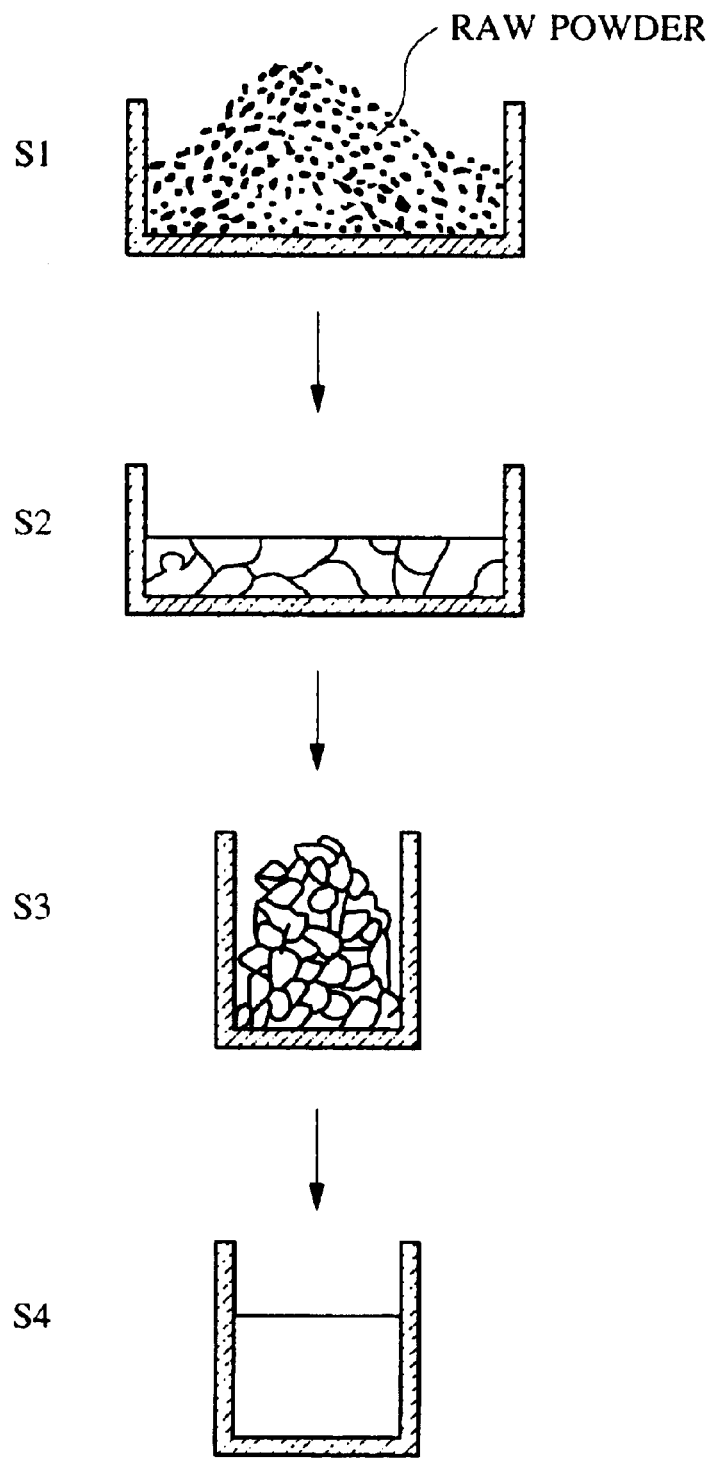
FIG. 8 is a schematic view illustrating a fluoride crystal production process.

FIG. 7 is a cross-sectional view of a crystal growing furnace which is used for making a fluoride crystal in a third embodiment in accordance with the present invention. This crystal growing furnace produces a disk-shaped fluoride crystal having a relatively large thickness and is called a disk-type furnace. The disk-type crystal growing furnace comprises a chamber 701, a thermal insulation material 702, a heater 703, partitions 707, a disk-type cylindrical crucible 708 for melting and crystallizing fluoride 705 and a crucible lowering mechanism 706. The crucible 708 is divided into a plurality of sections by the partitions 707 and the divided sections connect to each other through small openings 704 provided in the centers of the partitions 707. The same steps as in the first embodiment or as in the second embodiment are also applicable to the third embodiment except for the use of the disk-type crystal growing furnace. It is preferred that each section of the crucible 708 has a diameter larger than the first crucible 204 set forth in the first embodiment and has a volume sufficient to stack a plurality of fluoride crystals 705 after the preliminary treatment of the first embodiment. More preferable is a volume that permits stacking of two fluoride crystals. Also, it is preferred that each section of the crucible 708 has a volume sufficient to pile up a plurality of fluoride crystals, and in particular, two fluoride crystals after the pressing treatment of the second embodiment.

EXAMPLE 1

According to the flow chart set forth in FIG. 1, a calcium fluoride crystal was prepared. Details of individual steps are as follows:

(Preparation of Raw Material & Mixing Step)

Powdered calcium fluoride as a raw fluoride material was placed into a container and zinc fluoride ($ZnF_2$) as a scavenger in an amount of 0.5 wt % of the calcium fluoride was added. The volume of the container was twice that of the raw materials. The calcium fluoride and scavenger were thoroughly mixed by the rotation of the container.

(Preliminary Step)

Preliminary treatment of the fluoride mixture was performed with a refining furnace set forth in FIG. 2. The first crucible 204 was filled with the fluoride mixture. The first crucible 204 has a diameter approximately 10% smaller than the second crucible 304 which is used in the following crystal growing step. The filled first crucible was loaded into a refining furnace and the chamber 201 of the refining furnace was evacuated to remove water in the fluoride mixture. The first crucible 204 was heated with a heater 203 while the chamber was evacuated to $5 \times 10^{-4}$ Torr or less until the fluoride mixture was melted. The fluoride mixture was melted within a range between 1,390 and 1,450° C. After the fluoride mixture was completely melted, evacuation of the chamber was further enhanced to $2 \times 10^{-6}$ Torr or less. The heater 203 was de-energized to cool the crucible 204 to room temperature, the crystallized fluoride block 205 was taken out from the refining furnace, and the surface layer was removed by 1 mm.

(Crystal Growing Step)

A calcium fluoride single-crystal was grown in the crystal growing furnace set forth in FIG. 3. A given amount of $ZnF_2$ scavenger was placed into the second crucible 304 and the fluoride block was placed thereon. The second crucible 304 was loaded into the crystal growing furnace. The amount of the $ZnF_2$ scavenger was 0.2 wt % of the fluoride block. The chamber of the crystal growing furnace was evacuated to remove water in the fluoride block 305. The second crucible 304 was heated with the heater 303, while the chamber was evacuated to $5 \times 10^{-4}$ Torr or less until the fluoride block 305 was melted. The fluoride block 305 was melted within a range between 1,390 and 1,450° C. After the fluoride block 305 was completely melted, evacuation of the chamber was further enhanced to $2 \times 10^{-6}$ Torr or less and continued for approximately 10 hours after the temperature reached equilibrium. The second crucible 304 was lowered at a rate of approximately 2 mm/hour by the crucible lowering mechanism 306. When the second crucible 304 was completely lowered to a predetermined position, the heater 303 was de-energized to spontaneously cool the crucible 204 to room temperature, and the calcium fluoride single-crystal was taken out from the crystal growing furnace.

(Annealing Step)

The calcium fluoride single-crystal was annealed with the annealing furnace set forth in FIG. 4. The calcium fluoride single-crystal was placed into the annealing crucible 404, the space between the calcium fluoride single-crystal 405 and the crucible 404 was uniformly filled with 0.1 wt % of $ZnF_2$ scavenger. The chamber 401 in the annealing furnace was gradually heated with the heater 403 based on the following temperature program while evacuating the chamber:

Heating from room temperature to 900° C. (heating rate: 100° C./hour),

Holding at 900° C. for 20 hours,

Cooling from 900° C. to room temperature (cooling rate: 6° C./hour) The calcium fluoride single-crystal which was cooled to room temperature was taken out from the annealing furnace.

EXAMPLE 2

In Example 2, the same mixing step as in Example 1 was applied, and a pressing step was used instead of the preliminary step in Example 1. Thus, a crystal growing step different from that in Example 1 was applied to Example 2. The same annealing step as in Example 1 was applied to Example 2. The pressing and crystal growing steps are as follows:

(Pressing Step)

The pressing machine set forth in FIG. 6 was used for the pressing step. A given amount of raw powder fluoride mixture was placed into a mold 602 at φ128 mm and compressed with the pressing member 603 under a pressure of approximately 700 kgf/cm². The bulk density of the fluoride mixture increased 1.5 times as a result of the compression.

(Crystal Growing Step)

The crystal growing furnace set forth in FIG. 3 was used to grow a calcium fluoride single-crystal. The compressed fluoride block was placed into the second crucible 304 and the second crucible 304 was loaded into the crystal growing furnace. The chamber 301 in the crystal growing furnace was evacuated to remove water contained in the fluoride block. The crucible 304 was heated with the heater 303, while the chamber 301 was evacuated to $5 \times 10^{-4}$ Torr or less until the compressed fluoride block 305 was melted. The compressed fluoride block 305 was melted within a range between 1,390 and 1,450° C. After the compressed fluoride block 305 was completely melted, evacuation of the chamber was further enhanced to $2 \times 10^{-6}$ Torr or less and continued for approximately 10 hours after the temperature reached equilibrium. The second crucible 304 was lowered at a rate of approximately 2 mm/hour by the crucible lowering mechanism 306. When the second crucible 304 was completely lowered to a predetermined position, a voltage applied to the heater 303 was gradually decreased to cool the crucible 304 at a cooling rate of no more than approximately 100° C./hour. After the heater was deenergized, the second crucible 304 was spontaneously cooled to room temperature, and the calcium fluoride single-crystal was taken out from the crystal growing furnace.

Transmission spectra of the calcium fluoride single-crystals prepared in Examples 1 and 2 were measured. No absorption regions due to impurities were found in these spectra. Further, deterioration of transmittance characteristics due to ArF laser irradiation can be suppressed. Thus, a calcium fluoride single-crystal prepared by the method in accordance with the present invention has superior optical characteristics than those prepared by conventional processes.

It was found that Example 1 is preferable to Example 2 because the bulk density in Example 1 barely changes before and after the single-crystal growing step. A larger crystal can be prepared by either Example 1 or 2 compared with conventional processes. In Example 2, since the single pressing step substitutes for the melting and crushing steps which are essential in conventional processes, the throughput can be increased.

EXAMPLE 3

Powdered calcium fluoride and the scavenger $ZnF_2$ were mixed as in Example 1. The refining furnace set forth in FIG.

2 was used in the preliminary step which was the same as in Example 1. Amounts of the raw materials used were decreased compared with Example 1, and the size of the fluoride block obtained in the preliminary step was adjusted such that two fluoride blocks could be placed into each of the five sections in the crucible 708 set forth in FIG. 7. Two fluoride disks prepared in the refining furnace were placed in each section in the crucible 708, the scavenger was added, and single-crystals were grown under the same conditions as in Example 1. Fluoride single-crystals were annealed with an annealing apparatus provided with a crucible having almost the same configuration as that in FIG. 7. A lens was produced by shaping the resulting calcium fluoride crystal. An excimer laser beam which is used in exposure equipment for semiconductor device production was consecutively irradiated the calcium fluoride lens. A high inner light transmittance was observed after laser irradiation for a long time period.

In accordance with the method of the present invention, impurity inclusion can be prevented in the production process of the fluoride crystal, and the resulting fluoride crystal exhibits a high transmittance. Since the high transmittance does not deteriorate even when irradiated with shortwave, high-output light for long time periods, the fluoride crystal is highly reliable. Further, the method in accordance with the present invention enables optical article production from the fluoride crystal with low production costs and shortened production periods.

Figure 9:
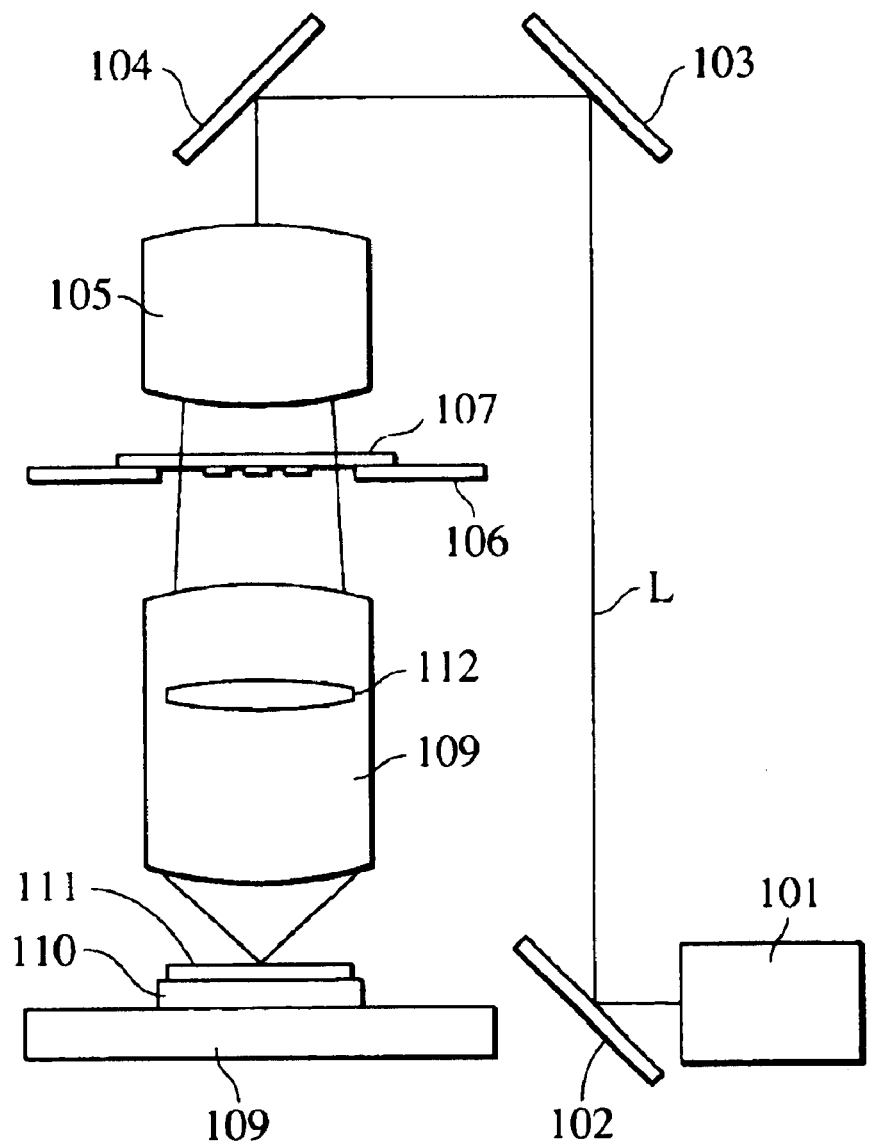
FIG. 9 is a schematic view of a semiconductor exposure apparatus into which a calcium fluoride lens according to an embodiment of the present invention is incorporated.

FIG. 9 is a schematic view of a semiconductor exposure apparatus into which the calcium fluoride lens according to any one of the preceding embodiments is incorporated. An excimer laser output device 101 produces excimer laser (KrF, ArF, or $F_2$) light L which is reflected by reflection mirrors 102, 103, and 104. The light is directed to an illumination optical system 105. The illumination optical system 105 serves to produce illumination light having a uniform light intensity distribution. With this illumination light, a reticle 107 held by a mask chuck 106 is illuminated at uniform illuminance. Pattern light form the reticle 107 is reduced by a projection optical system 109 having the calcium fluoride lens 112 which is the high inner light transmittance and the light is projected on a wafer 111 which is held on a wafer chuck 110, mounted on a stage 109.

With the pattern light (exposure light) from the reticle 107 and through the projection optical system 109, the pattern of the reticle 107 is imaged on the wafer 111 and thus is transferred thereto. Since the semiconductor exposure apparatus of this embodiment uses the calcium fluoride lens 112 such as described hereinbefore, the light transparency does not deteriorate by consecutive irradiation of high output short-wave light over long time periods. The calcium fluoride lens 112 may be disposed in the illumination optical system. Although not shown in the drawing, the exposure apparatus of this embodiment is equipped with an alignment optical system for measuring relative deviation between the reticle 107 and the wafer 111, a laser interferometer system for measuring the position of the stage 109, and a conveying system for conveying the wafer 111 and the reticle 107, for example. A stepper having an optical component, comprising a calcium fluoride lens 112 and an excimer laser (KrF, ArF, or $F_2$), such as described above, can be used to produce semiconductor devices.

Figure 10:
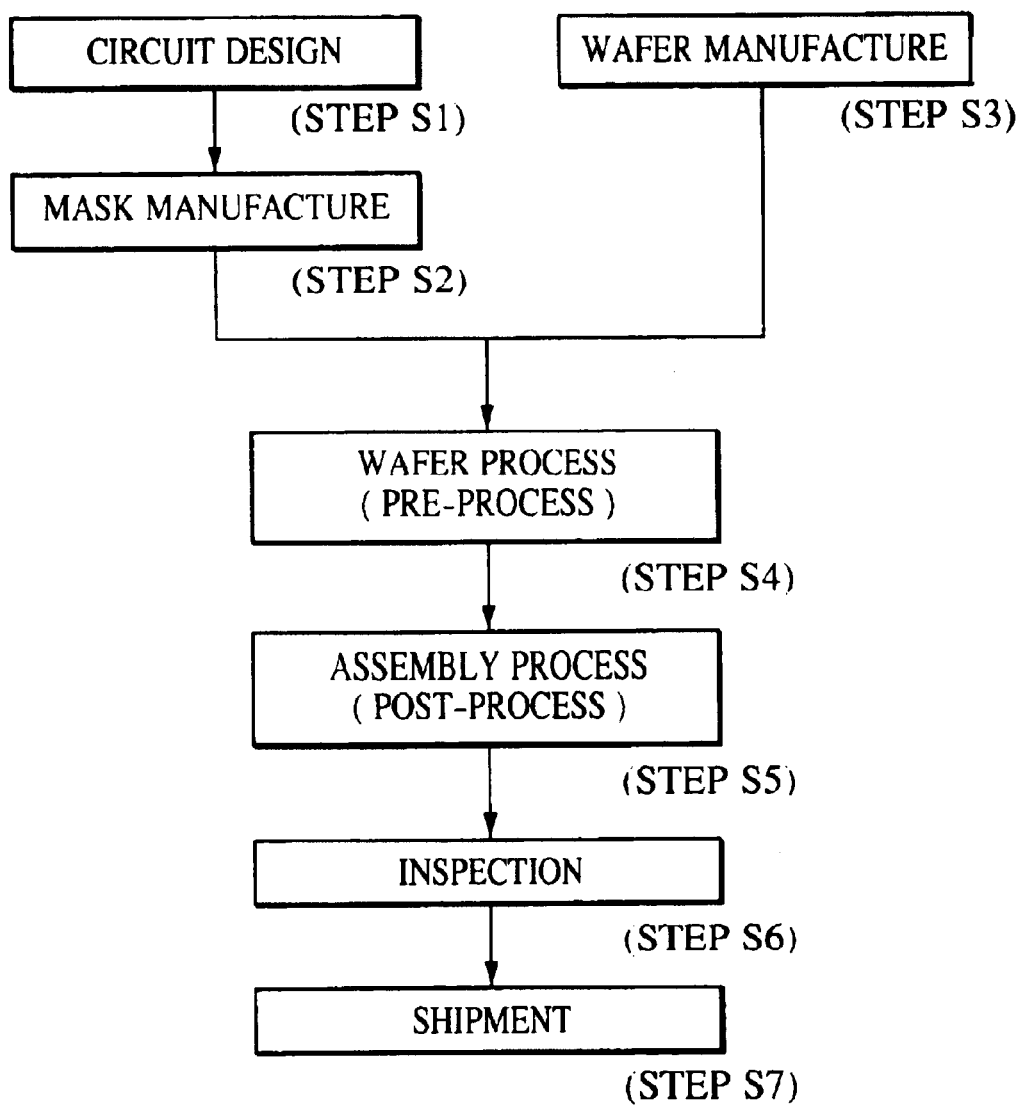
FIG. 10 is a flow chart of a procedure for manufacturing a semiconductor chip.

FIG. 10 is a flow chart of procedure for manufacture of semiconductor chips such as ICs or LSIs, liquid crystal panels, or CCDS, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. More specifically, a photomask is loaded into an exposure apparatus and is conveyed onto a mask chuck. When the mask is held by the chuck, mask alignment is performed. Subsequently, a wafer is loaded and, by using an alignment unit, any deviation between the photomask and the wafer is detected. A wafer stage is then moved to accomplish alignment between the mask and the wafer. After it is completed, an exposure process is executed. After completion of this exposure, the wafer is moved stepwise for exposure of a subsequent shot, and the procedure from the alignment operation is repeated.

Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein operation check, durability check and so on for the semiconductor devices provided by step 5, are carried out. With these processes, semiconductor devices are completed and they are shipped (step 7).

Figure 11:
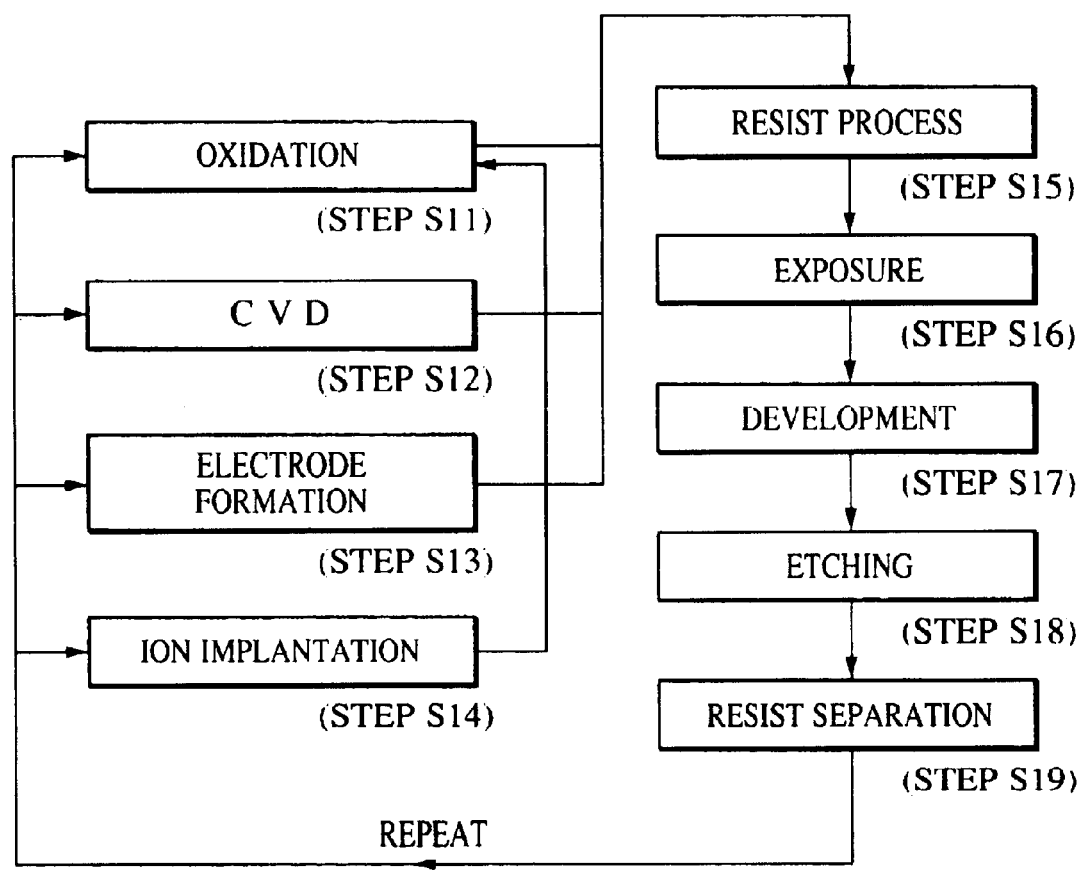
FIG. 11 is a flow chart illustrating a wafer process.

FIG. 11 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above, and by using a KrF excimer laser described with reference to FIG. 14. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the present invention has been described with reference to what are presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method of making a fluoride crystal comprising the following steps:
    a mixing step in which a prepared raw fluoride material is mixed with a scavenger to obtain a fluoride mixture;
    a preliminary step that comprises heating the fluoride mixture in a first crucible under evacuation and forming the fluoride mixture into a fluoride block or disk; and
    a crystal growing step that comprises forming a melt from the fluoride block or disk in a second crucible and cooling the melt to grow a fluoride crystal.

2. A method of making a fluoride crystal comprising the following steps:
- a mixing step in which a prepared raw fluoride material is mixed with a scavenger to obtain a fluoride mixture;
- a preliminary step that comprises heating the fluoride mixture in a first cylindrical crucible under evacuation and forming the fluoride mixture into a fluoride block or disk;
- a crystal growing step that comprises forming a melt from the fluoride block or disk in a second cylindrical crucible having a larger diameter than said first cylindrical crucible and cooling said melt to grow a fluoride crystal; and an annealing step that comprises annealing said grown fluoride crystal.

3. A method of making a fluoride crystal comprising the following steps:
- a mixing step in which a prepared raw fluoride material is mixed with a scavenger to obtain a fluoride mixture;
- a preliminary step that comprises heating the fluoride mixture in a first crucible under evacuation, then increasing the evacuation while forming the fluoride mixture into a fluoride block or disk; and
- a crystal growing step that comprises forming a melt from the fluoride block or disk in a second crucible and cooling the melt to grow a fluoride crystal.

4. A method of making a fluoride crystal comprising the following steps:
- a preliminary step that comprises melting a fluoride material with a scavenger in a first crucible under evacuation and cooling the fluoride material to form a block or a disk; and
- a crystal growing step that comprises melting the fluoride material in a second crucible and cooling the fluoride material to grow a fluoride crystal, after said preliminary step.

5. The method according to claim 4, further comprising a step of mixing the fluoride material and the scavenger.

6. The method according to claim 4, further comprising a step of removing a surface layer of the block or disk.

7. The method according to claim 4, further comprising a step of annealing the fluoride crystal.

8. The method according to claim 4, further comprising a step of annealing the fluoride crystal at a temperature of 900° C. to 1000° C.

9. The method according to claim 4, further comprising the steps of providing the fluoride crystal with the scavenger and annealing the fluoride crystal.

10. The method according to claim 4, wherein said preliminary step comprises heating the fluoride material at a temperature of 1390° C. to 1450° C.

11. The method according to claim 4, wherein the block or disk is a fluoride poly-crystal or single-crystal.

12. The method according to claim 4, wherein said growing step comprises heating the fluoride material at a temperature of 1390° C. to 1450° C.

13. The method according to claim 4, wherein said crystal growing step further comprises providing the fluoride material with the scavenger.

14. The method according to claim 4, wherein said crystal growing step comprises heating the fluoride material under evacuation.

15. The method according to claim 4, wherein said first crucible has the same diameter as that of said second crucible.

16. The method according to claim 4, wherein said first crucible has a smaller diameter than that of said second crucible.

17. The method according to claim 4, wherein said scavenger is zinc fluoride or bismuth fluoride.

18. The method according to claim 4, wherein said fluoride crystal is calcium fluoride.

19. The method according to claim 4, further comprising an external shaping step wherein the fluoride crystal is shaped to form an optical article.

20. The method according to claim 19, wherein an antireflection coating is formed on the fluoride crystal after the external shaping step.

21. A method of making a fluoride crystal optical article comprising the steps of:
- a preliminary step that comprises melting a fluoride material with a scavenger in a first crucible under evacuation and cooling the fluoride material to form a block or disk;
- a crystal growing step that comprises melting the fluoride material in a second crucible and cooling the fluoride material to grow a fluoride crystal, after said preliminary step;
- an external shaping step that comprises shaping the fluoride crystal; and
- a coating step that comprises forming an antireflection coating on the fluoride crystal after the external shaping step.

22. The method according to claim 21, wherein said fluoride crystal optical article is suitable for an excimer laser.

23. A method of making an optical system using a fluoride crystal optical article comprising the steps of:
- a preliminary step that comprises melting a fluoride material with a scavenger in a first crucible under evacuation and cooling the fluoride material to form a block or disk;
- a crystal growing step that compress melting the fluoride material in a second crucible and cooling the fluoride material to grow a fluoride crystal, after said preliminary step;
- an external shaping step that comprises shaping the fluoride crystal;
- a coating step that comprises forming an antireflection coating on the fluoride crystal after said external shaping step, whereby said fluoride crystal optical article is obtained; and
- a combining step that comprises combining said fluoride crystal optical article and an excimer laser source.

24. The method according to claim 23, wherein said fluoride crystal optical article is suitable for an excimer laser.

25. A method of making a fluoride crystal comprising the following steps:
- a preliminary step that comprises melting a fluoride material with a scavenger under evacuation and cooling the fluoride material to form a solid; and
- a crystal growing step that comprises melting the fluoride material and cooling the fluoride material to grow a fluoride crystal, after said preliminary step.

26. The method according to claim 25, wherein said preliminary step further comprises reducing pressure during melting.

27. The method according to claim 25, further comprising a step of mixing the fluoride material and the scavenger.

28. The method according to claim 25, further comprising a step of annealing the fluoride crystal.

29. The method according to claim 25, wherein said crystal growing step further comprises providing the fluoride material with the scavenger.

30. The method according to claim 25, wherein said crystal growing step further comprises heating the fluoride material under evacuation.

31. A method of making a fluoride crystal optical article comprising the step of:
- a preliminary step that comprises melting a fluoride material with a scavenger under evacuation and cooling the fluoride material to form a solid;
- a crystal growing step that comprises melting the fluoride material and cooling the fluoride material to grow a fluoride crystal, after said preliminary step; and
- an external shaping step that comprises shaping the fluoride crystal.

32. The method according to claim 31, wherein said preliminary step further comprises reducing pressure during melting.

33. The method according to claim 31, further comprising a step of forming an anti-reflection coating on the fluoride crystal after said external shaping step.

34. The method according to claim 31, wherein said fluoride crystal optical article is suitable for an excimer laser.

* * * * *

UNITED STATES PATENT AND TRADEMARK OFFICE
CERTIFICATE OF CORRECTION

PATENT NO. : 6,878,201 B2
DATED : April 12, 2005
INVENTOR(S) : Tomoru Oba et al.

It is certified that error appears in the above-identified patent and that said Letters Patent is hereby corrected as shown below:

Title page,
Item [56], References Cited, OTHER PUBLICATIONS, after "E.M. Olympios," reference, "CaF2" should read -- $CaF_2$. --.

Column 12,
Line 35, "compress" should read -- comprises --.

Signed and Sealed this

Sixteenth Day of August, 2005

JON W. DUDAS
*Director of the United States Patent and Trademark Office*